US009887667B2

(12) United States Patent
Dedic et al.

(10) Patent No.: US 9,887,667 B2
(45) Date of Patent: Feb. 6, 2018

(54) CLOCK GENERATION CIRCUITRY (71) Applicant: SOCIONEXT INC., Yokohama-shi, Kanagawa (JP)

(72) Inventors: Ian Juso Dedic, Middlesex (GB); David Timothy Enright, Maldon (GB)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 15/455,833

(22) Filed: Mar. 10, 2017

(65) Prior Publication Data
US 2017/0264241 A1 Sep. 14, 2017

(30) Foreign Application Priority Data
Mar. 11, 2016 (EP) .................................... 16160039

(51) Int. Cl.
*H03M 1/66* (2006.01)
*H03B 28/00* (2006.01)
*H01L 23/00* (2006.01)
*H03M 1/12* (2006.01)
*H03B 5/18* (2006.01)
*H03K 3/03* (2006.01)

(52) U.S. Cl.
CPC ............. *H03B 28/00* (2013.01); *H01L 24/16* (2013.01); *H03B 5/18* (2013.01); *H03B 5/1805* (2013.01); *H03B 5/1841* (2013.01); *H03K 3/0315* (2013.01); *H03M 1/12* (2013.01); *H03M 1/66* (2013.01); *H01L 2224/16225* (2013.01); *H01L 2924/14211* (2013.01); *H01L 2924/14253* (2013.01); *H03B 2200/0016* (2013.01)

(58) Field of Classification Search
CPC ........... H03M 1/66; H03M 1/12; H01L 24/16; H03B 28/00
USPC ............................................................ 331/46
See application file for complete search history.

(56) References Cited

U.S. PATENT DOCUMENTS

| 9,473,069 B1* | 10/2016 | Beccue .................. H03B 27/00 |
| 2002/0125960 A1* | 9/2002 | Pickering ................ H03L 7/089 331/25 |
| 2007/0257736 A1* | 11/2007 | Beccue .................... H03B 5/18 331/57 |
| 2010/0117744 A1* | 5/2010 | Takinami ................. H03K 3/86 331/45 |

(Continued)

FOREIGN PATENT DOCUMENTS

| EP | 2 211 468 A1 | 7/2010 |
| EP | 2 849 338 A1 | 3/2015 |

(Continued)

OTHER PUBLICATIONS

Extended European Search Report issued for European Patent Application No. 16160039.0—dated Sep. 20, 20116.

Primary Examiner — Lam T Mai
(74) Attorney, Agent, or Firm — Arent Fox LLP (57) ABSTRACT There is disclosed herein clock generation circuitry, in particular rotary travelling wave oscillator circuitry. Such circuitry comprises a pair of signal lines connected together to form a closed loop and arranged such that they define at least one transition section where both said lines in a first portion of the pair cross from one lateral side of both said lines in a second portion of the pair to the other lateral side of both said lines in the second portion of the pair.

18 Claims, 6 Drawing Sheets

(56) References Cited

U.S. PATENT DOCUMENTS

| | | | |
|---|---|---|---|
| 2010/0117748 A1* | 5/2010 | Le Grand De Mercey | H03B 5/26 331/107 SL |
| 2010/0117749 A1* | 5/2010 | Beccue | H03B 5/1852 331/117 FE |
| 2010/0253439 A1* | 10/2010 | Wood | G06F 1/10 331/46 |
| 2012/0319783 A1* | 12/2012 | Martchovsky | H03B 5/18 331/46 |
| 2013/0157584 A1 | 6/2013 | Tekin et al. | |
| 2014/0021622 A1* | 1/2014 | Bonilla | H01L 23/3192 257/773 |
| 2015/0364242 A1 | 12/2015 | Aboush et al. | |

FOREIGN PATENT DOCUMENTS

| | | |
|---|---|---|
| EP | 2 849 345 A1 | 3/2015 |
| WO | WO 00/44093 A1 | 7/2000 |
| WO | WO 2010/053215 A1 | 5/2010 |

* cited by examiner

A.       2F OSC + digital divider

B.       1F OSC + polyphase filter

C.       Coupled I/Q oscillators

CLOCK GENERATION CIRCUITRY

This application claims priority to European Patent Application No. 16160039.0 filed on Mar. 11, 2016. The disclosure of the priority application is incorporated in its entirety herein by reference.

The present invention relates to clock generation circuitry, particularly for quadrature clock signal generation and supply. Such quadrature clock signals may have relative phases 0°, 90°, 180° and 270°, respectively.

Quadrature clock signals may be required, for example, in DAC (digital-to-analogue converter) or ADC (analogue-to-digital converter) circuitry, which may for example require four-phase interleaved substantially sinusoidal clock signals. Of course, such clock generation circuitry could also be employed in applications other than in DAC and ADC circuitry.

An example of ADC circuitry requiring generation of quadrature clock signals can be found in EP 2 211 468, which is incorporated by reference into the present application. An example of DAC circuitry also requiring generation of quadrature clock signals can be found in EP 2 849 345, again which is incorporated by reference into the present application. The ADC in EP 2 211 468 comprises a sampler (see for example FIG. 10 of that document) which may perform four-way or four-phase time-interleaving so as to split an input current into four time-interleaved sample streams. Therefore, quadrature clock signal generation is required which outputs four clock signals 90° out of phase with one another. The sampler creates four streams that are effectively four time-interleaved streams of current pulses originating from (and together making up) an input current, each stream having a sample rate one quarter of the overall sample rate.

Figure 1:
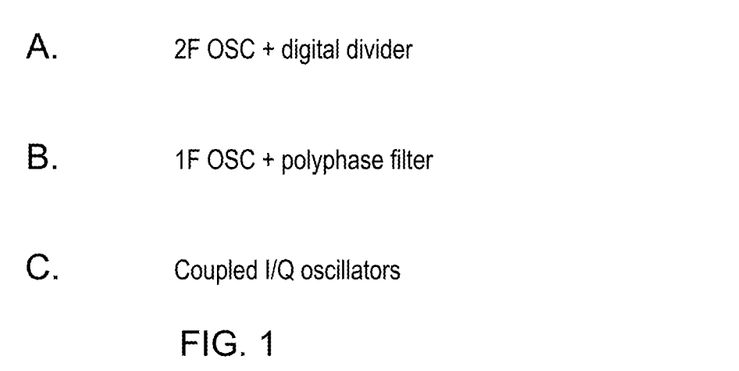
FIG. 1, as described hereinabove, shows the known methods for quadrature clock generation.

Previously-considered methods A, B and C for generation of such quadrature signals are summarised in FIG. 1.

The first method A uses a 2F LC oscillator (for example, F=32 GHz, 2F=64 GHz) to generate differential clock signals. A digital divider is then used to generate the required four phases. Disadvantages associated with this method include the power required for the divider, as well as the difficulty in achieving the required phase accuracy.

The second method B uses a 1F LC oscillator to generate differential clock signals, and then uses a polyphase filter (PPF) to generate the required four phases. For example, the design of buffers for use in such PPF circuitry is considered in EP 2 849 338. However, the PPF circuitry is relatively complex and there are difficulties with phase accuracy. Power consumption is also a problem.

The third method C uses coupled I/Q oscillators. However, there are difficulties as to how to couple such oscillators and control phase skew. There is also a power penalty associated with providing such circuitry.

It is desirable to provide clock signal generation circuitry, in particular for the generation of quadrature clock signals. It is desirable to provide such clock signal generation circuitry which avoids one or more of the disadvantages mentioned above.

According to an embodiment of a first aspect of the present invention, there is provided rotary travelling wave oscillator (RTWO) circuitry comprising a pair of signal lines connected together to form a closed loop and arranged such that they define at least one transition section or arrangement where both said lines in a first portion of the pair cross from one lateral side of both said lines in a second portion of the pair to the other lateral side of both said lines in the second portion of the pair.

The pair of signal lines may be considered to generally follow a path which crosses over itself at the transition section so that both said lines in a first portion of the pair make a transition from one lateral side to the other of both said lines in a second portion of the pair. This arrangement of the closed loop allows for quadrature signals, for example four quadrature signals, to be taken from the same side of the arrangement, so that each quadrature signal may be taken at a point which is close to the points at which the other quadrature signals are taken.

When compared to an RTWO without such a transition section, embodiments of the present invention are arranged so that two points that would be on opposite sides of the path meet (without interconnection) at the transition section. That is, the first and second portions of the transition section would, without the transition section, be at opposite sides of the path.

According to an embodiment of another aspect of the present invention, there is provided rotary travelling wave oscillator (RTWO) circuitry, comprising a pair of signal lines connected together to form a closed loop and arranged to both follow a path which defines a figure-of-eight shape. The signal lines may define at least one transition section where both said lines in a first portion of the pair make a transition or pass across from one lateral side to the other of both said lines in a second portion of the pair. The transition section may be at the crossover section of the figure-of-eight shape.

Thus, the configuration of the circuitry according to the above described aspect defines the closed loop arranged in a figure-of-eight shape. The central crossover of the figure-of-eight shape defines a transition section at which the path passes across itself so as to create, what may be referred to as, two half path loops.

It will be appreciated that even if more than one transition section were provided, for example an odd number such as three, the overall configuration may still be referred to as a figure-of-eight shape with the middle transition section of the three corresponding to the crossover in a traditional figure-of-eight, or "8", shape. Preferably the circuitry has (only) an odd number of transition sections, and preferably (only) one.

The closed signal-line loop of the RTWO circuitry may be a single loop without interruption. Preferably, the lines in the first portion of the transition section do not interconnect with the lines in the second portion of the transition section at the transition section, i.e. where they cross one another. The signal-line loop is therefore continuous and the signal lines at the transition section merely pass across each other and there is no (conductive) interconnection between the lines in the first portion and the lines in the second portion. That is, there is no direct electrical (conductive) connection between the crossing conductors of the signal lines at the transition section.

Thus, the overall RTWO operation is not disturbed or affected by the transition section, merely the locations at which a set of four quadrature clock signals may be tapped off. For example, the closed loop formed by the pair of signal lines may be a single closed loop, this single closed loop not forming sub-loops by interconnections.

Accordingly, the pair of signal lines may both follow a continuous path which crosses over itself at the transition section. The path may be arranged to define a figure-of-eight shape, with the transition section being at the central crossover section of the figure-of-eight.

The pair of signal lines may be generally arranged alongside or parallel to each other so that they generally follow the same path. In terms of following the path, the arrangement of the signal-line loop and transition section is such that, when a potential difference occurs across the adjacent signal lines at a point along the path, the resultant travelling wave may travel around the half loop of the path that is one side of the transition section in the clockwise direction and then travel around the half loop of the path on the other side of the transition section in the anticlockwise direction.

In preferred embodiments, the pair of signal lines are transmission lines. Furthermore, they may preferably serve as a pair of differential transmission lines.

The arrangement of the RTWO circuitry may be such that, when in use, the frequency of a travelling wave travelling around the closed signal-line loop is proportional to the length of the closed loop, assuming that the signal lines are uniform along their lengths. The length of the signal-line loop may therefore define the frequency of the generated clock signal as 1F. Accordingly, the length of the signal-line loop may be set (or adjusted during design) to set the frequency of travelling wave which would be set up or generated in the circuitry in use. For example, the length of the signal-line loop (transmission line) may be doubled to halve the frequency.

At the transition section, the signal lines may preferably be arranged so that each signal line of the first portion goes over one signal line of the second portion and under the other signal line of the second portion. The transition section may therefore be symmetrical about its centre. The signal lines may be arranged so that, at the transition section, both said lines in the first portion are substantially perpendicular to both said lines in the second portion. Such perpendicular crossing is however only one example of angles at which the lines may cross relative to one another.

The closed loop may be arranged so that the pair of signal lines are configured in a balanced arrangement such that a travelling wave travelling around the closed loop would spend equal amounts of time either side of the transition section. Thus, the length and/or characteristic impedance of the signal lines in one half loop of the closed loop may be the same as for the signal lines in the other half loop of the closed loop.

Furthermore, the closed path loop may preferably be substantially symmetrical about the transition section. That is, the half path loop on one side of the transition section may be such that the signal lines are the same length and follow the same pattern as the signal lines in the half path loop on the other side of the transition section.

When in use, the relative phases of signals tapped off the pair of signal lines in the first portion may be 0° and 180°, respectively, and the relative phases of signals tapped off the pair of signal lines in the second portion may be 90° and 270°, respectively.

Thus, the pair of signal lines may be configured in a symmetrical arrangement such that a set of relative phases 0°, 90°, 180° and 270° of a travelling wave travelling around the closed loop would occur at a corresponding set of virtual points along the signal lines which fall on a virtual line, preferably a straight virtual line. That is, the signals that are 90° apart may be taken from such a set of points where the signal lines of one half loop are adjacent to the signal lines of the other half loop, i.e. immediately either side of the transition section along the signal lines. Such virtual lines may be moved towards the transition section so that the quadrature signal points move closer together until they converge in the transition section, for example where the signal lines crossover each other.

The symmetrical arrangement of the pair of signal lines may be such that it provides a plurality of said sets of virtual points, each said set of virtual points being on their own virtual line, the virtual lines being generally parallel with one another. The virtual lines are preferably straight virtual lines, with the four corresponding sections of signal line running parallel to one another and perpendicular to the virtual lines. Where the four sections of signal line follow sections of the path which converge at the transition section, such virtual lines may be non-straight or curved. It will be appreciated that as such sets of points cross from one side of the transition section to the other, the two points that were in one half path loop pass to the other half path loop, and vice versa.

The signal lines may be configured to have uniform properties along their lengths. The balanced and/or symmetrical arrangements may be defined based on lengths of the signal lines and/or their relative spatial layout.

The closed loop of the RTWO circuitry may be arranged so that it is substantially symmetrical about the transition section. That is, the arrangement of the signal lines running along the path loop may be substantially mirrored along an imaginary vertical and/or horizontal line drawn through the centre of the transition section. The half loops of the closed path may therefore be substantially symmetrical either side of the transition section. The difference between "real" and "dummy" cross-connection sections as described later herein may disturb such symmetry.

According to an embodiment of another aspect of the present invention, there is provided digital-to-analogue converter (DAC) circuitry or analogue-to-digital converter (ADC) circuitry, which comprises the rotary travelling wave oscillator circuitry according to the aforementioned aspects of the present invention. Therefore RTWO circuitry embodying the present invention may be provided with DAC and/or ADC circuitry.

According to an embodiment of a further aspect of the present invention, there is provided an IC chip, such as a flip chip, comprising such rotary travelling wave oscillator circuitry, or such digital-to-analogue converter (DAC) or analogue-to-digital converter (ADC) circuitry. That is, the RTWO circuitry of embodiments of the present invention may be provided on an IC chip. The integrated circuitry may have one or more layers, e.g. metal layers, wherein the signal-line loop (e.g. the conductor of a transmission line) is formed across a plurality of such layers.

The present invention extends to method aspects corresponding in scope with the aforementioned aspects of the present invention.

Reference will now be made, by way of example, to the accompanying drawings, of which.

The present inventors have studied circuitry corresponding to the methods A, B and C of FIG. 1. However, they have identified the rather distant rotary travelling wave oscillator (RTWO) as being suitable for quadrature signal generation with the above-mentioned ADC and DAC circuitry in mind.

Figure 2:
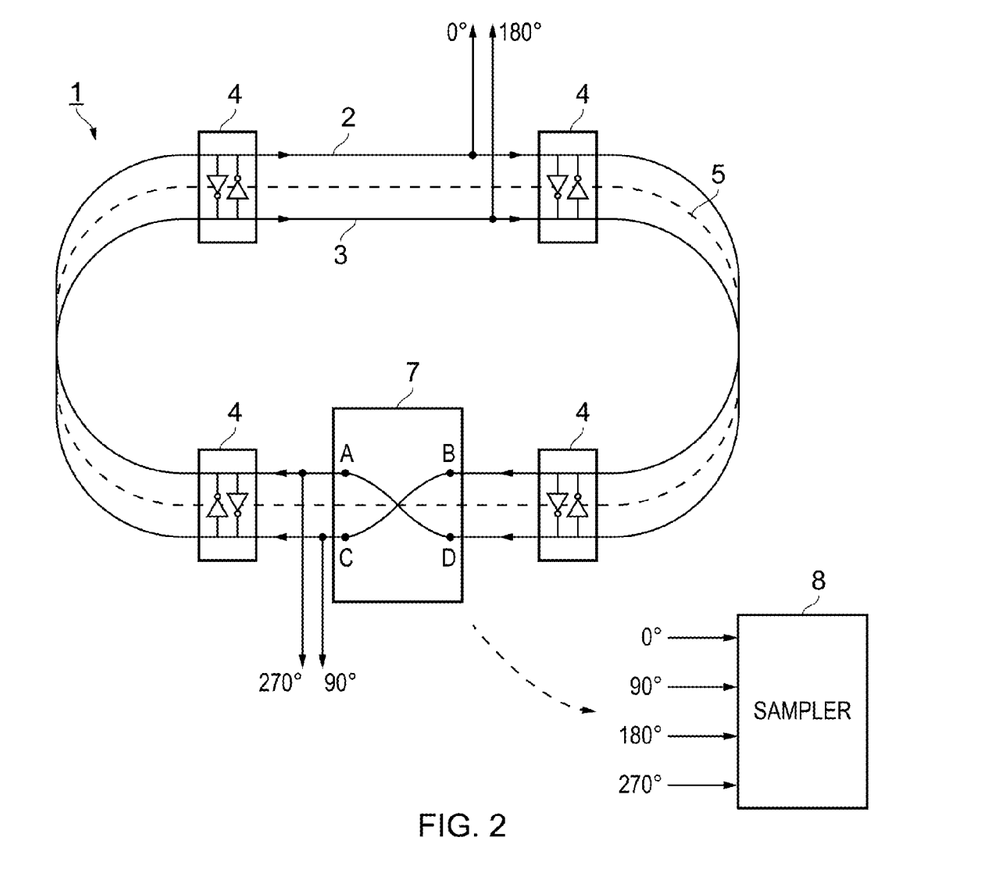
FIG. 2, is a schematic diagram of an example RTWO.

FIG. 2 is a schematic diagram of an example RTWO 1 for generating quadrature phase signals. RTWO 1 comprises a pair of signal lines 2 and 3 and a number of regeneration elements 4.

Signal line 2 has ends A and B and signal line 3 has ends C and D. The signal lines 2 and 3 are connected end-to-end, i.e. with end B connected to end C and end D connected to end A, to form a closed or endless loop of signal line. It will be appreciated that such signal lines may be implemented as (ideally, lossless) transmission lines, and the present disclosure will be understood accordingly.

Note that the pair of signal lines 2 and 3 generally follow a path 5 which itself forms an endless loop. Thus, the loop of signal line (the signal-line loop) effectively travels twice around the loop defined by the path 5 (the path loop 5).

The circuitry essentially corresponds to an open loop of differential signal line, i.e. running from ends A and C round to ends B and D, but with the ends cross-connected at cross-connection section 7 such that the signal line becomes an endless or closed loop of signal line. If the cross-connection section 7 were removed and a voltage applied over one of the two ends of the differential line, e.g. across the ends A and C, a voltage wave would begin to travel around the loop to ends B and D. With the cross-connection section 7 in place, and if there were no losses, the wave (consider e.g. a rising edge) would travel around the signal-line loop indefinitely, providing a full clock cycle every time the wave returns to its starting point.

To counter the losses, multiple regeneration elements 4 are distributed at locations around the path loop and are connected between the adjacent lines. The regeneration elements 4 may be or comprise antiparallel inverter pairs (as indicated in FIG. 2), which effectively provide gain and drive the travelling wave, overcoming the losses and helping lock the rotation. At any point on the path loop 5 whilst a wave is travelling around the signal-line loop, the intention is that if signals were taken or tapped from the two adjacent conductors of the signal lines 2 and 3 at that point then those signals would be 180° out of phase with one another (supported by the antiparallel inverter pairs). Therefore, with a voltage-signal wave travelling around the loop, a differential clock signal is available at any point on the path loop 5 (i.e. by taking or tapping signals from the adjacent signal lines 2 and 3 at that point).

An advantage of such circuitry is that it can operate at the desired frequency (i.e. 1F), and that there is no need to add circuits to deal with phase error or to suffer their associated power penalty. The frequency of the clock signal can be determined by the electrical size of the signal-line loop, i.e. how long it takes for the travelling wave to complete a lap of the signal-line loop, given that loop's signal line characteristics. Typically, the signal line would have uniform properties along its length so that the length of the line is proportional to the clock frequency.

The phase of a wave travelling around the signal line completes one 360° cycle from one point on the signal line round to the same point on the signal line. From a starting point at 0°, the phase of the travelling wave will increase as it moves around the loop, before reaching 360°/0° again.

Thus, it is possible to obtain a quadrature clock signal by taking clock signals at different points on the signal-line loop.

Since the phase difference between clock signals taken from adjacent signal lines 2 and 3 at any point on the path loop is 180° and one full cycle of the signal-line loop (i.e. two laps of the path loop 5) is 360°, the points directly opposite each other on the path loop 5 will be 90° out of phase. Therefore, in order to obtain quadrature clock signals, two clock signals (for example, 0° and 180°) must be taken from one side of the path loop 5 and the other two clock signals (for example, 90° and 270°) must be taken from the opposite side of the path loop 5. FIG. 2 shows two example locations along the path loop 5 where quadrature clock signals could be taken, however these are simply examples.

As stated above, the quadrature clock signals need to be taken from opposite sides of the path loop 5 and therefore problems arise when arranging the layout of the RTWO oscillator 1 and other circuitry which operates based on clock signals tapped off that RTWO oscillator 1. For example, it may be necessary for the four clock signals to be input to a single circuitry block, such as the sampler 8 shown in FIG. 2 which corresponds to the sampler disclosed in EP 2 211 468 (see FIGS. 9 and 10 of that document). Therefore, getting the clock signals from opposite sides of the path loop 5 to the same circuitry block causes design problems, not only in the routing of the signal lines or tracks to the intended circuitry block 8, but also in the associated losses, impedances and other characteristics of signal lines of different lengths at high frequencies and the associated impact on the relative phases of those clock signals.

Figure 3:
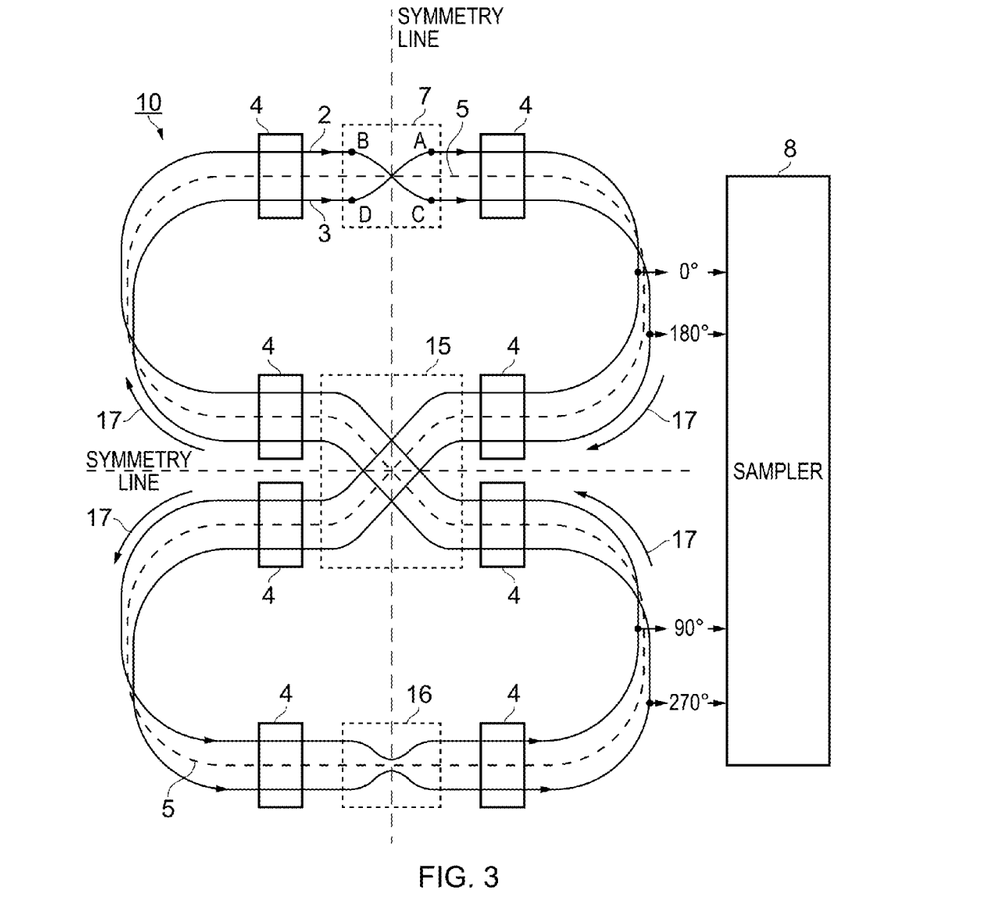
FIG. 3 is a schematic diagram representing RTWO circuitry according to a general embodiment of the present invention.

FIG. 3 is a schematic diagram of RTWO circuitry 10 embodying the present invention. For ease of comparison, those elements of RTWO circuitry 10 having corresponding elements in FIG. 2 are denoted in the same way. Thus, the RTWO circuitry 10 comprises a pair of signal lines 2 and 3 and a number of regeneration elements 4 (shown simply as boxes). Signal line 2 has ends A and B and signal line 3 has ends C and D, as in FIG. 2. The signal lines 2 and 3 are also connected end-to-end as in FIG. 2, i.e. with the end B connected to end C and end D connected to end A, to form a closed or endless loop of signal line. Again, such signal lines may be implemented as (ideally, lossless) transmission lines and the present disclosure will be understood accordingly.

Similarly to the RTWO circuitry 1 of FIG. 2, note that the pair of signal lines 2 and 3 in the RTWO circuitry 10 of FIG. 3 generally follow a path 5 which itself forms an endless loop. Thus, the loop of signal line (the signal-line loop) effectively travels around the loop defined by the path 5 (the path loop 5). However, note that the path 5 of the RTWO circuitry 10 defines a figure-of-eight shape, i.e. an "8" shape, in that the path 5 crosses itself forming two half path-loops.

The closed signal-line loop is arranged to have a transition section 15 at which both signal lines 2 and 3 of the closed signal-line loop in a first portion of the pair make a transition from or cross from one lateral side of both signal lines in a second portion of the pair to the other lateral side of both signal lines in that second portion of the pair, as can be seen from FIG. 3. Thus, the closed signal-line loop of the RTWO circuitry 10 is arranged so that both signal lines 2 and 3 pass across each other at the transition section 15.

In the RTWO circuitry 10 in FIG. 3, the pair of signal lines 2 and 3 thus both generally follow the path 5 which defines a figure-of-eight shape, with the transition section 15 at the crossover section of the path 5. At the transition section 15, the signal lines in the first portion do not interconnect or cross-connect with the signal lines in the second portion. That is, although the signal lines 2 and 3 pass across each other, there is no electrical (i.e. conductive) interconnection and the closed signal-line loop in the present embodiment is a single continuous loop in the same sense as in FIG. 2, with no interruptions.

To avoid such cross-connection at the transition section, the crossings in the transition section involve one of the lines going over or under the line it is crossing, with the crossing lines insulated from one another at that point, for example using multiple metal layers in integrated circuitry having a layered structure. Such metal layers are typically separated by via layers, and are thus insulated from each other except for where vias are formed. A possible configuration will be explored in more detail below.

As with the RTWO of FIG. 2, the signal lines 2 and 3 in the RTWO circuitry 10 interconnect at the connection section 7 which appears in FIG. 3 at the top. This is the only point in the path loop 5 at which the two signal lines 2 and 3 (the two conductors of the corresponding transmission lines) interconnect in the circuitry 10. This is in order to create the closed or endless signal-line loop as discussed above and respect the basic operation of an RTWO. A number of regeneration elements 4 are located around the path loop 5 as indicated schematically in FIG. 3, as for the RTWO of FIG. 2. As discussed above, these regeneration elements 4 counter the losses in the signal-line loop and may be, for example, antiparallel inverter pairs. For simplicity, the regeneration elements 4 are represented in FIG. 3 as boxes as already mentioned. Their exact number and location is not critical to the present invention. It would be known to a person skilled in the art that an RTWO would comprise one or more regeneration elements 4, located between the conductors of the signal lines 2 and 3.

In order to keep the lengths of transmission line (signal line) in the two half loops of the path 5 the same and thus provide symmetry to the arrangement, a "dummy" cross-connection section 16 may be provided in the half path loop not containing the "real" cross-connection section 7. In the case of FIG. 3, this is shown in the lower half path loop. The "dummy" cross-connection section 16 corresponds to the "real" cross-connection section 7 and may therefore be located in the corresponding position in the other half loop, i.e. opposite the "real" cross-connection section 7 about the horizontal dashed line of symmetry shown in FIG. 3. Note that another line of symmetry could also be drawn passing vertically through the transition section 15 and passing through both the "real" and "dummy" cross-connection sections 7 and 16.

Note that there is no actual cross-connection in the "dummy" cross-connection section 16, hence the name. The lengths of the wires in the "dummy" cross-connection section 16 are configured to be the same as the length of the wires in the "real" cross-connection section 7, again to enable the overall circuitry 10 to have a generally symmetrical layout.

Figure 4:
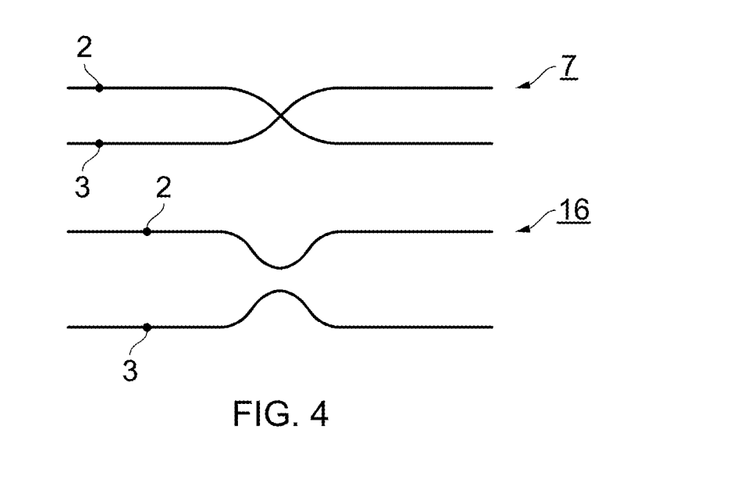
FIG. 4 is a schematic diagram showing an enlarged view of the real connection section and dummy connection section according to an embodiment of the present invention.

FIG. 4 is a schematic diagram showing an enlarged view of the real cross-connection section 7 and the "dummy" cross-connection section 16 of FIG. 3. As can be seen from FIG. 4, the signal wires do not actually cross over one another or interconnect at the "dummy" cross-connection section 16 and the arrangement merely replicates the general arrangement of the "real" cross-connection section 7 without the conductors connecting or crossing over one another. Although the signal lines 2 and 3 are shown as curving inwardly towards one another in the dummy cross-connection section 16 in FIGS. 3 and 4, those signal lines could for example curve outwardly or away from one another instead, and achieve the same overall effect of keeping the lengths of signal line the same and thus the symmetry of the overall arrangement. Other variations are of course possible.

Figure 5:
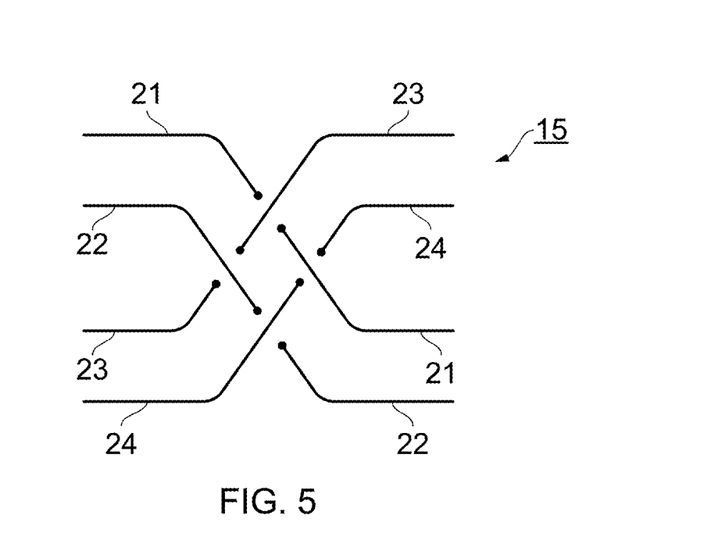
FIG. 5 is a schematic diagram showing an enlarged view of the transition section according to an embodiment of the present invention.

The transition section 15 may be implemented as shown in FIG. 5, which is a schematic diagram showing an enlarged view of the transition section 15. As can be seen from FIG. 5, each signal-line conductor in the first portion passes over one conductor in the second portion and passes under the other conductor in the second portion. In FIG. 5, the first portion of the pair of signal lines 2 and 3 is denoted by line portions 21 and 22 and the second portion of the pair of signal lines 2 and 3 is denoted by the line portions 23 and 24. This arrangement provides symmetry in the transition section 15 and ensures that the length of the conductors in the first portion are the same as each other and are the same as the length of each of the conductors in the second portion. Furthermore, the 'one over, one under' arrangement keeps the parasitic capacitances to substrate and between lines the same for each conductor and crossing point.

As can be seen from FIG. 3, one advantage of the arrangement according to a general embodiment of the present invention is that quadrature clock signals can be taken from the same side of the arrangement, i.e. signals mutually 90° out of phase with each other can be taken from a set of points in the same physical location of the arrangement or in locations very close to each other. If one imagines moving the indicated points (0°, 90°, 180° and 270°) together in the same direction forwards around the loop (for example, in the direction indicated by the arrows 17), one will notice that they come together towards the centrally located transition section 15, at which point they may appear together along the same imaginary vertical line.

Thus, arranging the RTWO circuitry 10 with a transition section 15 and with the signal lines symmetrically arranged as in FIG. 3, enables sets of points to be next to or close to each other whereas in FIG. 2 they would be on opposite sides of the closed path loop.

Figure 6:
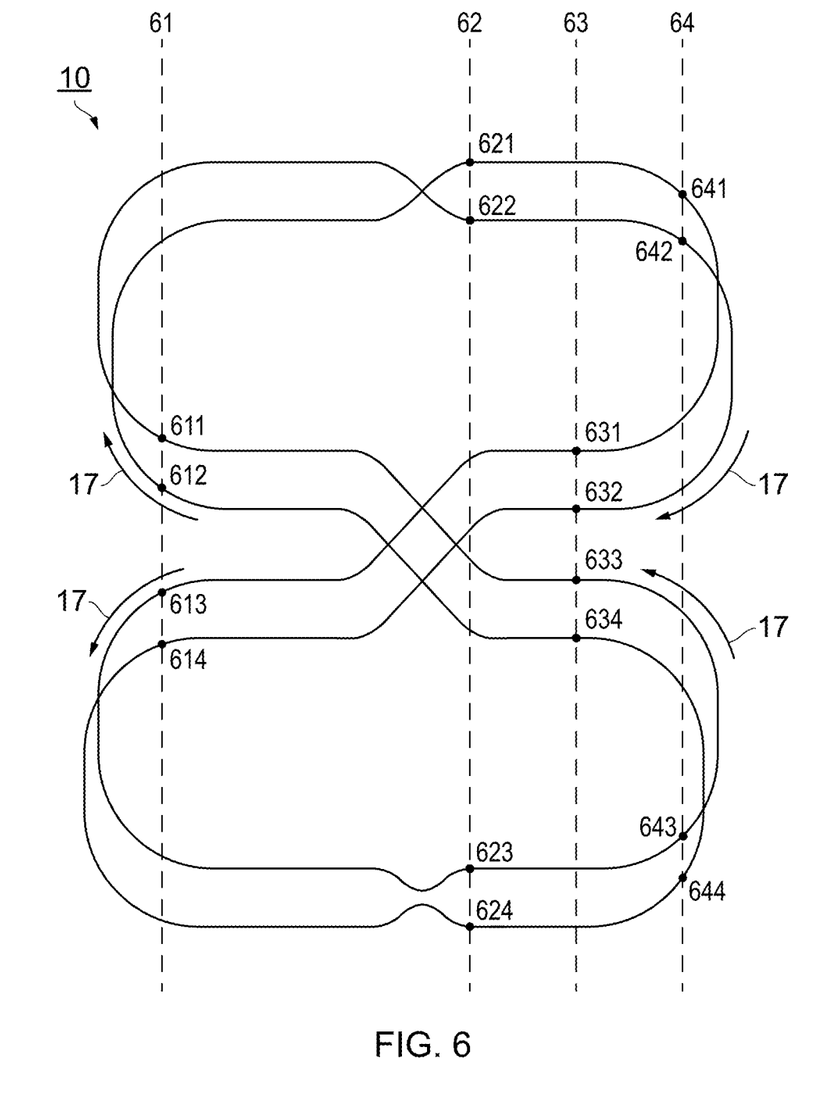
FIG. 6 is a schematic diagram showing exemplary locations at which quadrature clock signals may be taken from the RTWO circuitry of FIGS. 3 to 5.

FIG. 6 is another schematic diagram of the RTWO circuitry 10, provided to show a number of example sets of points at which quadrature clock signals may be taken from the RTWO circuitry 10. A number of virtual lines 61 to 64 are shown in FIG. 6 simply as examples of possible locations at which sets of points exist where signals that are mutually 90° out of phase may be found along the same vertical line. Each such line 61 to 64 has a set of four points indicated on it at which quadrature clock signals can be found. For example, where line 61 intersects the closed loop of signal line there are four indicated points 611, 612, 613 and 614, with the four points on each of the other lines 62 to 64 being denoted in a similar manner. Clock signals 90° apart in phase may be taken from these points, such as, for example 0° at point 631, 90° at point 633, 180° at point 632 and 270° at point 634, for line 63, these phases being relative to one another.

If one imagines moving these indicated sets of points together in the same direction around the loop of signal line, for example in the direction indicated by the arrows 17, the phases of the signals at those points will increase equally. That is, as the vertical lines are translated sideways over the circuitry 10 the virtual points move around the signal-line loop together, with the relative phases found at those points increasing in the same way as one another. The phase difference between the points will therefore remain at 90°. Thus, the RTWO circuitry 10 shown in FIGS. 3 and 6 in fact offers many locations where quadrature clock signals can be taken from a set of closely or similarly located points or locations.

Since the quadrature clock signals can be taken from a set of locations that are very close to each other, the design limitations associated with the FIG. 2 RTWO 1 can be overcome. That is, unlike the known RTWO 1, the quadrature signals do not need to be taken from opposite sides of the path loop 5. This means that the design of overall circuitry layout is made easier, particularly with the task in mind of getting a set of four quadrature clock signals to a common circuitry block 8.

The layout of the resulting circuitry is therefore much better and the problems associated with routing the signal lines (tracks or transmission lines) and the associated losses and impedances, especially at high frequencies, are reduced. The embodiments of the present invention therefore provide improved circuitry for generating quadrature clock signals, since the quadrature clock signals can be taken from the same physical location (or from regularly located locations, such as on straight lines) in the circuitry 10. For example, see the sets of points which fall on vertical straight lines in FIG. 6. Such clock signals may thus be provided to a circuit block such as sampler 8 using signal lines of a similar length and which are laid out in a similar manner (e.g. with those lines running parallel to one another or in a regular array where the lines have the same length, same set of turns, and/or run in the same metal layers, etc., as one another).

Figure 7:
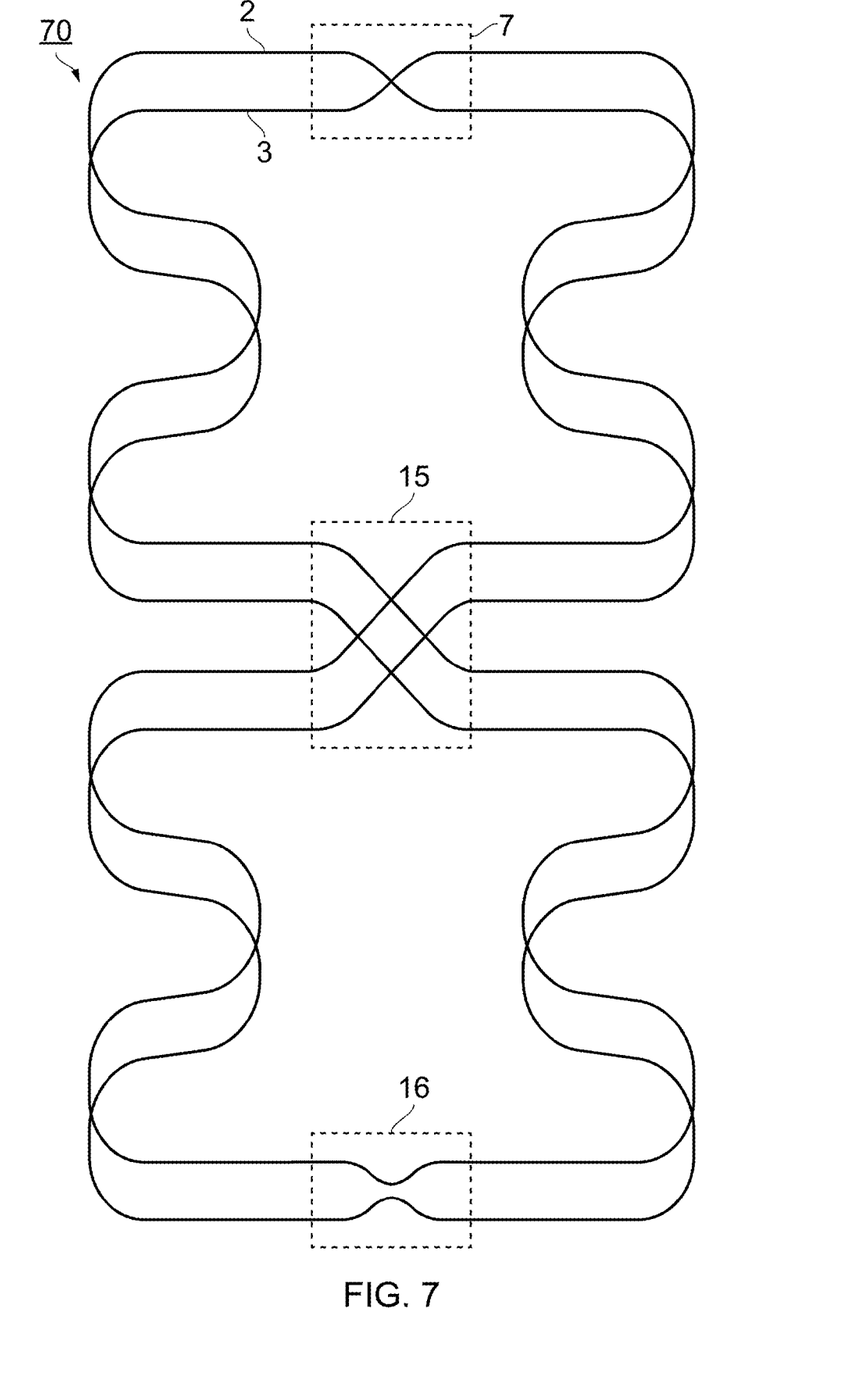
FIG. 7 is a schematic diagram representing RTWO circuitry according to another embodiment of the present invention.

FIG. 7 is a schematic diagram of RTWO circuitry 70 which is similar to the RTWO circuitry 10. Thus, like elements are denoted in the same way.

As can be seen from FIG. 7, the closed loop of the arrangement is altered to effectively double the height of the arrangement and (more importantly) to double the length of the signal lines. This arrangement, when in use, results in a generated clock signal frequency which is half of that generated using the RTWO circuitry 10 of FIG. 3. The length and arrangement of the signal lines may therefore be readily designed in order to achieve a desired clock frequency, whilst retaining the benefits of the circuitry in FIG. 3 (i.e. the general symmetry and ability to tap off quadrature clock signals at sets of points along parallel vertical lines, those points being available close together towards the transition section).

The shape of the half path loops of the path 5 may take the form of loops themselves, such as those shown in FIGS. 3 and 7. However, they may of course take the form of other shapes. The shape of the individual half path loops is not as important as the two half path loops being substantially symmetrical (for example, in the sense of the lengths of the signal lines and their arrangement) and the travelling wave taking the same amount of time to travel around each half loop. Indeed, it will be appreciated that the symmetry is more important closer to the transition section 15 where the sets of points mentioned above are close together, and less important particularly far away from the transition section where the sets of points mentioned above are no longer so close together (and thus no longer so attractive from the point of view of supplying a circuit block with a set of quadrature clock signals).

According to the embodiment shown in FIG. 7, the quadrature signals may still be taken from the same side of the loop as each other. However, the track length is doubled and so the travelling wave takes twice as long to travel around the loop, which in turn halves the frequency of the generated clock signal. This arrangement therefore provides an improved device for generating quadrature signals, with the length of the signal lines being proportional to the frequency of the signals.

The operating frequency of the RTWO may also be controlled using other methods, such as, for example, using capacitors. One or more capacitance components may be added between the signal lines in order to slow down the travelling waveform and therefore to tune the frequency of the RTWO. Some such capacitance components may be fixed capacitances. Others may be variable capacitors, with some being used to (coarsely) bring the operating frequency close to a target value and the others to fine-tune the operating frequency. This process may be carried out at startup or during runtime, e.g. dynamically.

Circuitry of the present invention may form part of an analogue-to-digital converter (ADC) and/or a digital-to-analogue converter (DAC). The circuitry may be employed, for example, with the ADC of EP 2 211 468 discussed above. Accordingly, the quadrature signals may be taken from (approximately) the same location of an RTWO according to embodiments of the present invention and then connected to the sampler of EP 2 211468.

Circuitry of the present invention may be implemented as integrated circuitry, for example on an IC chip such as a flip chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

The present invention may be embodied in many other different forms, within the spirit and scope of the appended claims.

The invention claimed is:

1. Rotary travelling wave oscillator circuitry, comprising a pair of signal lines connected together to form a closed loop and arranged such that they define at least one transition section where both said lines in a first portion of the pair cross from one lateral side of both said lines in a second portion of the pair to the other lateral side of both said lines in the second portion of the pair,
   wherein:
   the pair of signal lines both follow a continuous path which crosses itself at the transition section;
   the path defines a figure-of-eight shape; and
   the transition section is at the crossover section of the figure-of-eight shape.

2. The rotary travelling wave oscillator according to claim 1, wherein at the transition section the lines in the first portion cross the lines in the second portion without interconnection therebetween.

3. The rotary travelling wave oscillator circuitry according to claim 1, wherein the pair of signal lines are generally arranged alongside or parallel to each other.

4. The rotary travelling wave oscillator circuitry according to claim 1, wherein the pair of signal lines is a set of differential transmission lines.

5. The rotary travelling wave oscillator circuitry according to claim 1, wherein at the transition section both said lines in the first portion are substantially perpendicular to both said lines in the second portion.

6. The rotary travelling wave oscillator circuitry according to claim 1, wherein the transition section is arranged so that each signal line in the first portion crosses over one signal line in the second portion and under the other signal line in the second portion.

7. The rotary travelling wave oscillator circuitry according to claim 1, wherein the pair of signal lines are configured in a balanced arrangement such that a travelling wave travelling around the closed loop would spend equal amounts of time either side of the transition section.

8. The rotary travelling wave oscillator circuitry according to claim 1, wherein the pair of signal lines are configured in a symmetrical arrangement such that a set of relative phases 0°, 90°, 180° and 270° of a travelling wave travelling around the closed loop would occur at a corresponding set of virtual points along the signal lines which fall on a straight virtual line.

9. The rotary travelling wave oscillator circuitry according to claim 8, wherein the symmetrical arrangement is such that it provides a plurality of said sets of virtual points, each said set of virtual points being on their own straight virtual line, the straight virtual lines being generally parallel with one another,
    optionally wherein sections of said signal lines running through said parallel straight virtual lines at the corresponding virtual points are arranged parallel to one another and perpendicular to those virtual lines.

10. The rotary travelling wave oscillator circuitry according to claim 7, wherein said signal lines are configured to have uniform properties along their lengths, and wherein said balanced and/or symmetrical arrangements are defined based on lengths of said signal lines and their relative spatial layout.

11. The rotary travelling wave oscillator circuitry according to claim 1, wherein the closed loop is substantially symmetrical about the transition section.

12. Digital-to-analogue converter circuitry or analogue-to-digital converter circuitry, comprising the rotary travelling wave oscillator circuitry according to claim 1.

13. An IC chip, comprising the rotary travelling wave oscillator circuitry of claim 1.

14. An IC chip, comprising the digital-to-analogue converter circuitry or analogue-to-digital converter circuitry of claim 12.

15. The IC chip of claim 13, wherein the IC chip comprises a flip chip.

16. The IC chip of claim 14, wherein the IC chip comprises a flip chip.

17. Rotary travelling wave oscillator circuitry, comprising a pair of signal lines connected together to form a closed loop and arranged such that they define at least one transition section where both said lines in a first portion of the pair cross from one lateral side of both said lines in a second portion of the pair to the other lateral side of both said lines in the second portion of the pair,
    wherein the pair of signal lines are configured in a balanced arrangement such that a travelling wave travelling around the closed loop would spend equal amounts of time either side of the transition section.

18. Rotary travelling wave oscillator circuitry, comprising a pair of signal lines connected together to form a closed loop and arranged such that they define at least one transition section where both said lines in a first portion of the pair cross from one lateral side of both said lines in a second portion of the pair to the other lateral side of both said lines in the second portion of the pair,
    wherein the pair of signal lines are configured in a symmetrical arrangement such that a set of relative phases 0°, 90°, 180° and 270° of a travelling wave travelling around the closed loop would occur at a corresponding set of virtual points along the signal lines which fall on a straight virtual line.

* * * * *